US006821865B2

(12) United States Patent
Wise et al.

(10) Patent No.: US 6,821,865 B2
(45) Date of Patent: Nov. 23, 2004

(54) DEEP ISOLATION TRENCHES

(75) Inventors: Michael Wise, Lagrangeville, NY (US); Andreas Knorr, Austin, TX (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/248,233

(22) Filed: Dec. 30, 2002

(65) Prior Publication Data

US 2004/0126986 A1 Jul. 1, 2004

(51) Int. Cl.[7] .............................................. H01L 21/762
(52) U.S. Cl. ................. 438/435; 438/697; 257/E21.546
(58) Field of Search .................. 257/E21.546; 438/435, 438/692, 699, FOR 227; 148/DIG. 50

(56) References Cited

U.S. PATENT DOCUMENTS

| | | | |
|---|---|---|---|
| 5,480,763 A | | 1/1996 | Kondo et al. |
| 5,721,173 A | * | 2/1998 | Yano et al. ................. 438/424 |
| 5,880,007 A | * | 3/1999 | Varian et al. ............... 438/427 |
| 6,171,896 B1 | | 1/2001 | Jang et al. |
| 6,171,962 B1 | | 1/2001 | Karlsson et al. |
| 6,210,846 B1 | | 4/2001 | Rangarajan et al. |
| 6,214,695 B1 | * | 4/2001 | Inoue et al. ................. 438/424 |
| 6,242,322 B1 | * | 6/2001 | Chen et al. ................. 438/424 |
| 6,245,641 B1 | * | 6/2001 | Shiozawa et al. ............ 438/427 |
| 6,251,783 B1 | | 6/2001 | Yew et al. |
| 6,265,302 B1 | | 7/2001 | Lim et al. |
| 6,667,223 B2 | | 12/2003 | Seitz |
| 2001/0049179 A1 | | 12/2001 | Mori |
| 2002/0175146 A1 | * | 11/2002 | Dokumaci et al. ............ 216/88 |
| 2003/0013270 A1 | * | 1/2003 | Seitz .......................... 438/424 |
| 2003/0013271 A1 | * | 1/2003 | Knott et al. ................. 438/435 |

OTHER PUBLICATIONS

U. Gruening et al., "A Novel Trench DRAM Cell with a Vertical Access Transistor and Buried Strap (Verl Best) for 4Gb/18Gb", International Electron Device Meeting (IEDM'99) Technical Digest, pp25–28, 1999.

Radens, C.J., et al., "An Orthogonal 6F² Trench–Sidewall Vertical Device Cell for 4Gb/16Gb DRAM," IEEE, 2000.

Kersch, A., et al., "Recent Advances in Feature Scale Simulation," Infineon Technologies AG, Munich, Germany, date unknown.

* cited by examiner

Primary Examiner—George Fourson
(74) Attorney, Agent, or Firm—Slater & Matsil, L.L.P.

(57) ABSTRACT

A method of forming deep isolation trenches in the fabrication of ICs is disclosed. The substrate is prepared with deep isolation trenches. The isolation trenches are partially filled with a first dielectric material. An etch mask layer is deposited on the substrate and used to remove excess first dielectric material on the surface of the substrate. The isolation trenches are then completely filled with a second dielectric material. Excess second dielectric material is then removed from the surface of the substrate.

36 Claims, 8 Drawing Sheets

DEEP ISOLATION TRENCHES

BACKGROUND OF THE INVENTION

Deep isolation trenches filled with a dielectric material, such as oxide, are used to isolate devices of an integrated circuit. Deep isolation trenches are particularly useful for isolating memory cells employing trench capacitors with vertical transistors. Such types of memory cells are described in, for example. U. Gruening et al, "A Novel Trench DRAM Cell with a Vertical Access Transistor and Buried Strap (VERI BEST) for 4 Gb/16 Gb", International Electron Device Meeting (IEDM '99) Technical Digest, pp. 25–28, 1999, when is herein incorporated by reference for all purposes. A plurality of memory cells are interconnected by wordlines and bitlines to form a memory array. The memory array forms, for example, a memory IC, such as dynamic random access memory (DRAM) IC.

The devices of an IC can be arranged in different configurations or layouts. Typically, the layout includes areas with densely and non-densely packed device regions. For example, a memory IC comprises densely packed memory cells (transistors and storage nodes) in the array region and loosely packed support circuitry in the non-array region. The size of devices can also vary widely, resulting in deep isolation trenches and active areas located in between them having different widths.

FIG. 1 shows a cross-sectional view of a portion of a partially processed memory IC. As shown, the substrate includes array and non-array regions 105 and 106. Typically, narrower and more densely packed deep isolation trenches 130 are located in the array region to separate memory cells and wider and less densely packed isolation trenches 120 are located in the non-array region. The isolation trenches are The aspect ratio (i.e., depth/width) of the deep trenches in the array region is about 3:1 or higher. The depth of the trench is typically about 300 to 700 nm below the silicon level. To effectively fill trenches with such high aspect ratio, high density plasma (HDP) chemical vigor deposition (CVD) techniques are used. This is because HDP-CVD techniques have a higher vertical fill rate relative to the sidewall growth rate, which increases the gapfill capability compared to conventional conformal CVD techniques such as low pressure CVP (LPCVD) or sub-atmosphere CVD (SA-CVD), HDP-CVD techniques also produce a denser oxide than other conventional CVD techniques, which is not easily affected by subsequent etch processes.

A unique surface topography, in which the oxide protrudes angularly from the trenches, is produced by HDP-CVP. Substantially sloping edges are formed as the oxide layer coats the surface of the substrate. The excess material on the surface of the substrate is subsequently removed by chemical mechanical polishing (CMP). Due to the depth of the deep trenches, a thick oxide deposition is required to completely fill the trenches. The thick oxide deposition results in an equally thick dielectric layer over the surface of the substrate. This thick oxide deposition makes planarization by CMP very difficult, and often results in dishing 127 in wide openings and poor uniformity in the removal of excess oxide from the surface of the substrate. Poor uniformity can lead to variations in device characteristics and shorting problems between, for example, wordlines to wordlines with bitlines.

Another problem associated with HDP oxide is that voids can be formed in the deep isolation trenches. Although the vertical rate of deposition is much higher than the horizontal component (about 3:1 to 10:1), the high aspect ratio of the isolation trenches may result in the opening at the top being closed before completely filling the trenches. This results in voids being formed in the deep isolation trenches. Voids near the surface of the isolation trenches next to the active areas are extremely critical, causing a leakage of currents or even shorting of woldlines or wordlines with bitlines, rendering the isolation trenches ineffective.

From the above discussion, there is desire to improve the fabrication of deep isolation trenches, which avoids dishing, poor uniformity and voids.

SUMMARY OF INVENTION

The present invention relates to the fabrication of ICS. More particularly, the invention relates to a method of forming deep isolation trenches in the fabrication of ICs. A substrate is prepared with deep isolation trenches. In accordance with the invention, the isolation trenches are partially filled with a first dielectric material. In one embodiment, an etch mask layer is used to remove excess first dielectric material on the surface of the substrate. The isolation trenches are then completely filled with a second dielectric material. Excess second dielectric material is removed from the surface of the substrate. By filling the deep isolation trenches in multiple fill steps, various advantages such as better planarity and uniformity are obtained.

DETAILED DESCRIPTION

FIGS. 2–8 show a process for forming deep trenches used in ICs in accordance with one embodiment of the invention. In one embodiment, the deep trenches are used in the fabrication of memory ICs (e.g., DRAMs or SDRAMs) to isolate memory cells using trench capacitors with vertical transistors. Using deep trenches in other applications or ICs are also useful. Typically, in IC fabrication, a plurality of ICs is formed on the wafer in parallel. After processing is finished, the wafer is diced to separate the ICs into individual chips. The chips are then packaged, resulting in a final product that is used in, for example, consumer products such as computer systems, cellular phones, personal digital assistants (PDAs) and other electronic products.

Figure 1:
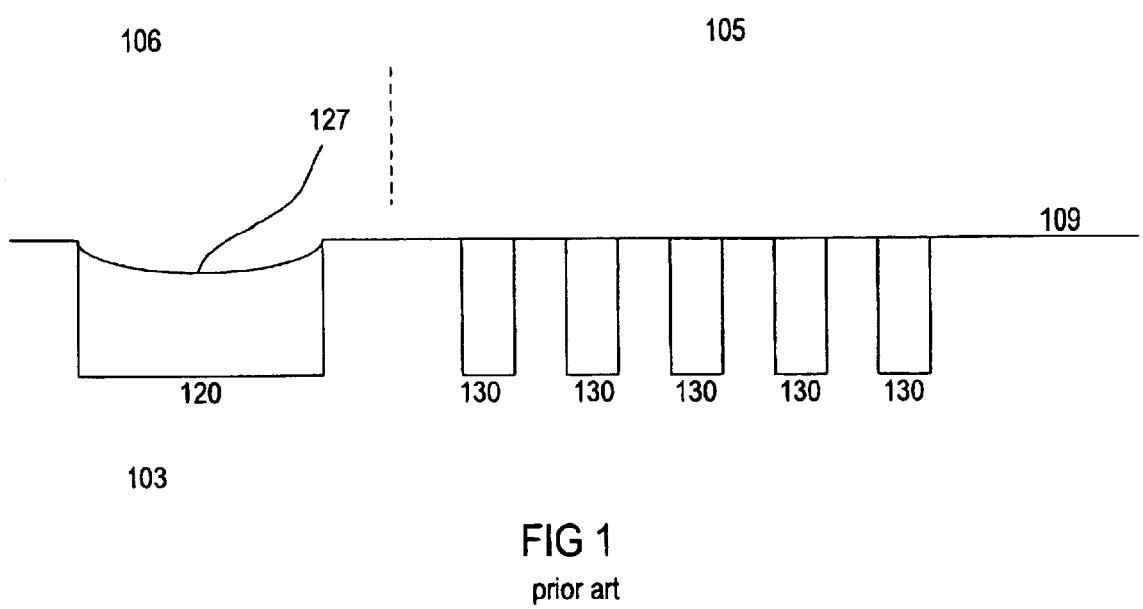
FIG. 1 shows a portion of a substrate having deep trenches.
Figure 2:
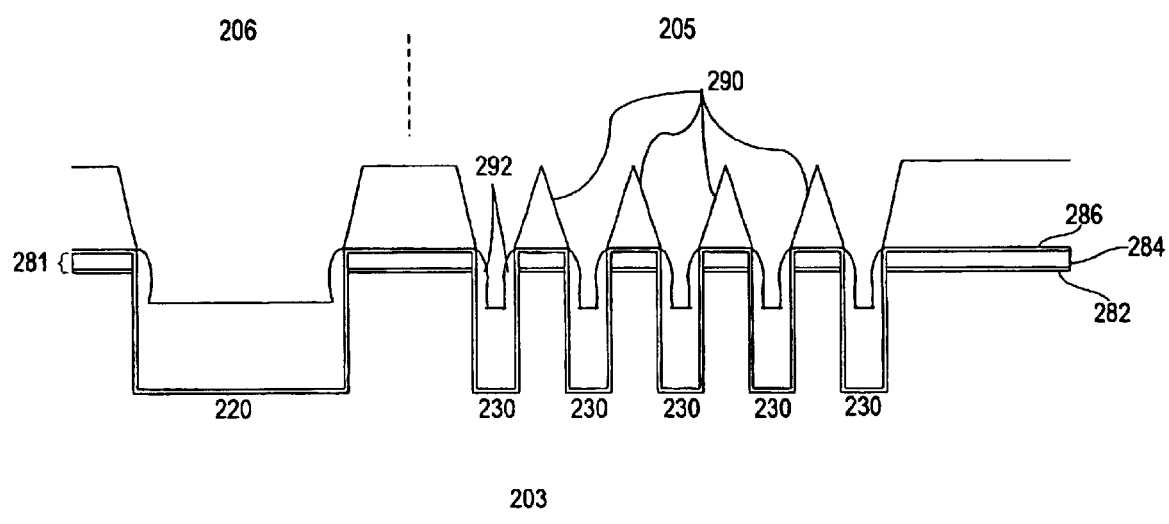
FIGS. 2–8 show a process for forming deep trenches in accordance with one embodiment of the invention.

Referring to FIG. 2, a cross-sectional view of a portion of a partially processed IC is shown. As shown, a substrate 203 is provided. The substrate comprises, for example, silicon. Other types of semiconductor substrates such as gallium arsenide, germanium, silicon on insulator (SOI), or other semiconductor materials are also useful. The substrate, in one embodiment, includes a plurality of services such as trench capacitors of memory cells (not shown) in the array region of the substrate. Providing a substrate prepared with other types of devices is also useful. The devices may be formed at various intermediate points in the process, depending on the types of devices.

A hard mask 281 is provided on the surface of the substrate. The hard mask, in one embodiment, comprises silicon nitride 284 and a pad oxide 282. The pad oxide, for example, promotes adhesion between the substrate and silicon nitride. The hard mask, in one embodiment, is part of the hard mask used to form the trench capacitors. Typically, the hard mask used to form trench capacitors includes silicon oxide, silicon nitride and pad oxide. During the process of forming the trench capacitors, the silicon oxide may be removed. In an alternative embodiment, the hard mask comprises silicon oxide on top of silicon nitride and pad oxide. Other types of hard masks can also be used.

The hard mask is patterned to provide openings corresponding to the locations where deep isolation trenches are to be formed. Patterning of the hard mask can be achieved using conventional lithographic techniques. For example, a photoresist layer is deposited on the surface of substrate and patterned by selectively exposing the resist layer to radiation using a mask. Depending on the type of resist used, the exposed (positive tone resist) or unexposed (negative tone resist) areas are removed. The patterned resist layer serves as an etch mask for patterning the hard mask. The substrate is then etched to the hard mask, forming isolation trenches using, for example, reactive-ion-etch (RIE) techniques. In one embodiment, narrow and densely packed isolation trenches 230 are formed in a first section 205 of the substrate and wider and less densely packed trenches 220 are formed in a second section 206. The first section, for example, corresponds to the array region while the second section corresponds to the support region of a memory IC. The depth of the trenches is, for example, about 600 700 nm and the width is about the critical feature size or minimum lithographic feature size F, for isolation trenches in the array region. The aspect ratio of the deep isolation trenches in the array region in one embodiment is about 3:1 or higher.

After the trenches are formed, the substrate is oxidized by, for example, furnace or rapid thermal processing (RTP) processes. The oxidation process rounds the corners of the trenches. This is done to reduce leakage current, and improve the reliability and performance of the IC. In one embodiment, a protective liner layer 286 is deposited on the substrate to line the sidewalls and bottom of the trenches. In one embodiment, the liner layer comprises a material which the dielectric material of the isolation trenches can be removed selective thereto. Preferably, the liner layer comprises a dielectric material. In one embodiment, the liner layer comprises silicon nitride. The silicon nitride is deposited by, for example, chemical vapor deposition. Other deposition techniques are also useful. The nitride liner should be sufficiently thick to protect the oxidized silicon in the active areas (or substrate surface and sidewalls of the trenches in the array region) during processing. Typically, the nitride liner is about 5–15 nm thick.

After the isolation trenches are formed, they are partially filled with a dielectric material. In one embodiment, the dielectric material comprises silicon oxide. The trenches are preferably filled with oxide deposited by HDP-CVD. HDP-CVD techniques are described in, for example, Conti, R., Economikos, L., Ivers, T., Knorr, A., Papasouliotis, G., "Processing Methods to Fill High Aspect Ratio Gaps Without Premature Constriction", DUMIC, February 1999, which is herein incorporated by reference for all purposes. In accordance with one embodiment of the invention, the trenches are filled in multiple processes. In one embodiment, the trenches are filled using first and second fill processes. The first fill process partially fills the isolation trenches. The first fill process fills the trenches to about 30–80%. Preferably, the first fill process should partially fill the trenches without forming any voids. During the partial filling of the deep trenches, excess oxide material is formed on the surface of the substrate. As shown, the excess material comprises an angular shape 290 due to the HDP process. An isotropic etch is performed in one embodiment to remove the oxide 292 formed on the trench sidewalls above the oxide from the partial fill. In one embodiment, a wet etch selective to oxide and silicon is used to remove the oxide from the trench sidewalls.

Figure 3:
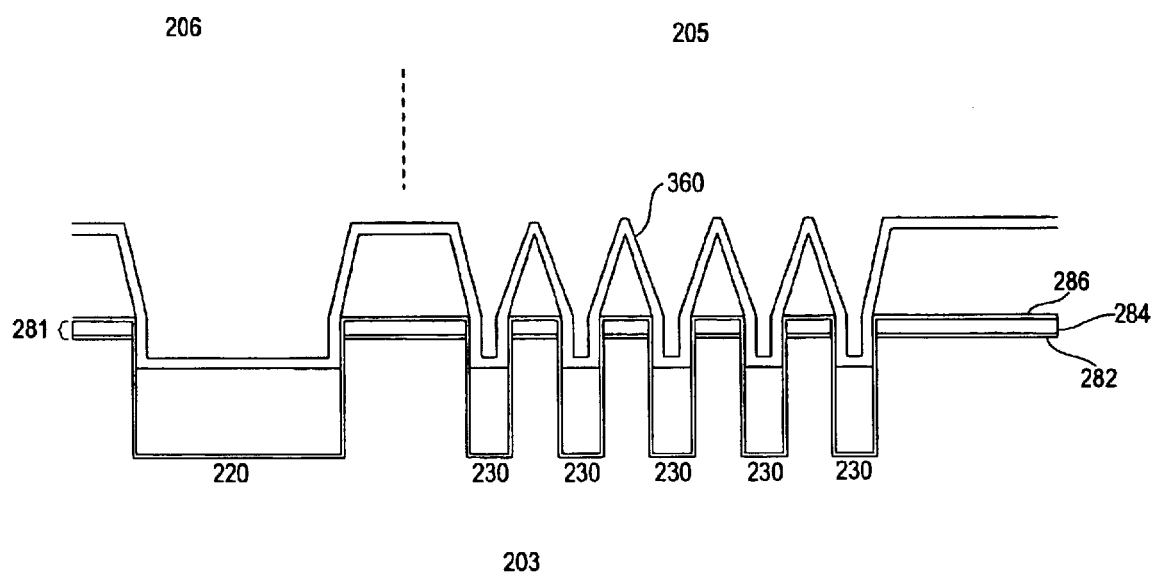

Referring to FIG. 3, a wet etch mask layer 360 is deposited on the substrate to cover the dielectric material after removal of the excess oxide from the sidewalls. The etch mask layer lines the surface of the substrate and sidewalls of the deep trenches above the partial oxide fill. The etch mask comprises a material which oxide can be removed selectively thereto. Also, the etch mask layer comprises a material which can be removed selective to the liner layer. In one embodiment, the etch mask comprises polysilicon. Other types of materials which the oxide can be removed selectively thereto as well as being capable of selective removal to the liner layer can also be used. The thickness of the etch mask should be sufficiently thick to enable complete removal of the oxide material on the substrate surface while protecting the oxide in the trenches. In one embodiment, the etch mask is about 50–300 Å thick.

Figure 4:
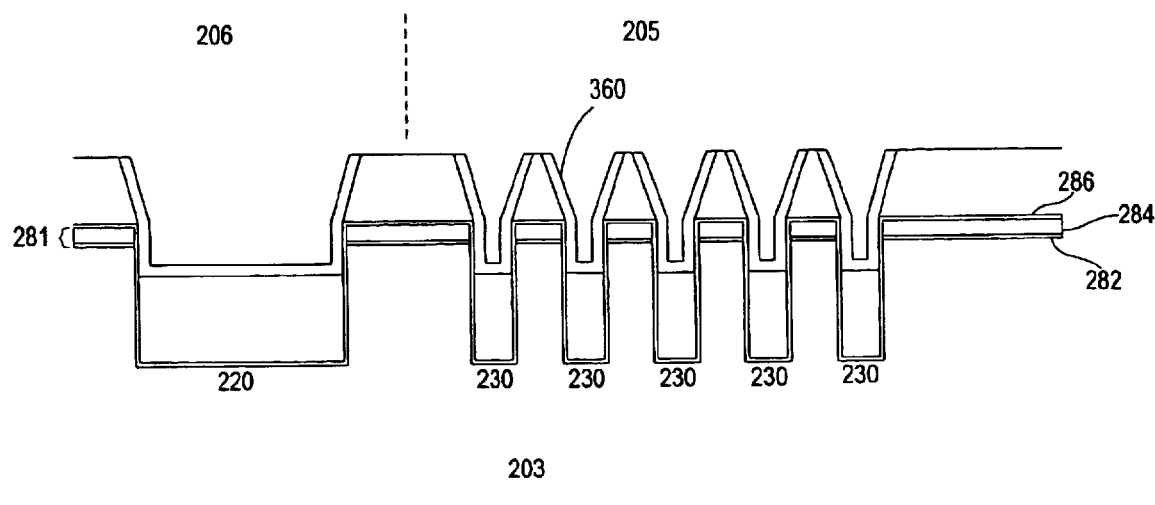

Referring to FIG. 4, portions of the etch mask layer are removed to expose the oxide on the surface of the substrate. In one embodiment, a polishing process, such as CMP is used. The CMP process can stop at any point, as long as the oxide on the substrate surface is exposed. This advantageously provides a large process window.

Figure 5:
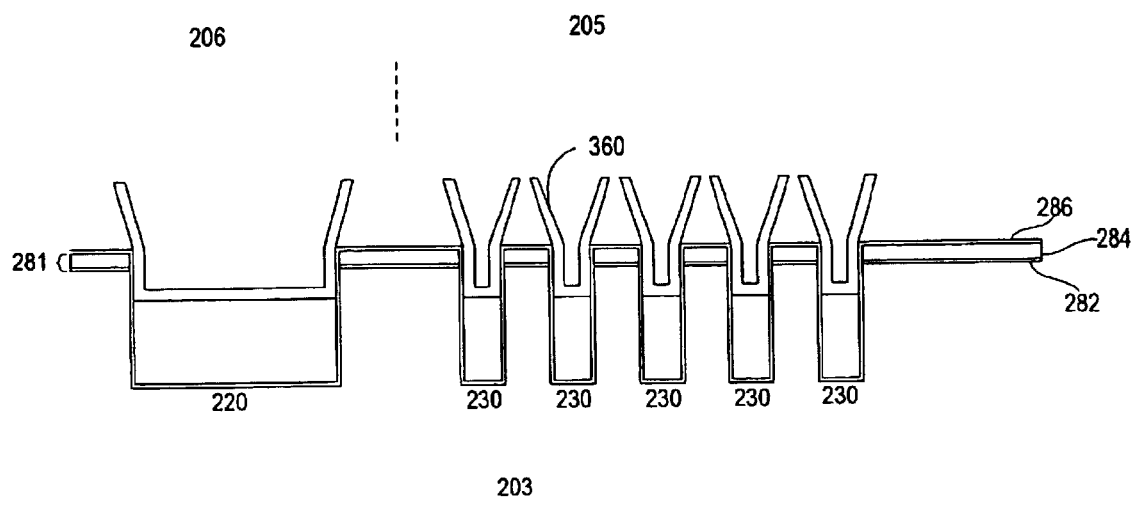

The excess dielectric material on the surface of the substrate is then removed by an etch, as shown in FIG. 5. In one embodiment, the etch comprises a wet etch selective to the etch mask. In one embodiment, the wet etch removes the oxide selective to the poly etch mask. By using the poly etch mask, a large overetch tolerance exists because the trench oxide is isolated from the oxide on the surface of the substrate.

Figure 6:
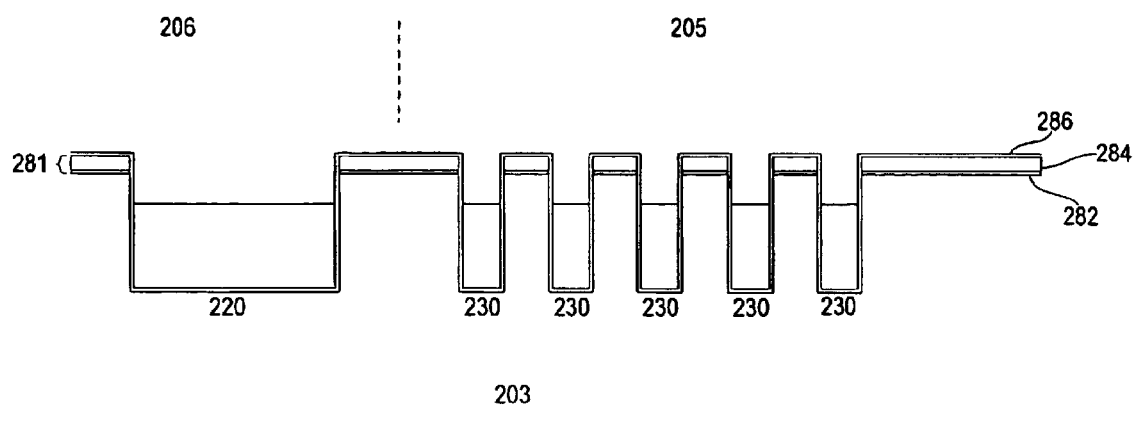

Referring to FIG. 6, the etch mask is removed. In one embodiment, the etch mask is removed with a wet etch selective to the hard mask 281, nitride liner 286, and oxide. Other types of etches, such as chemical downstream etching (CDE) or reactive ion etching (RIE), are also useful. The nitride liner protects the active area from the etch chemistry.

Figure 7:
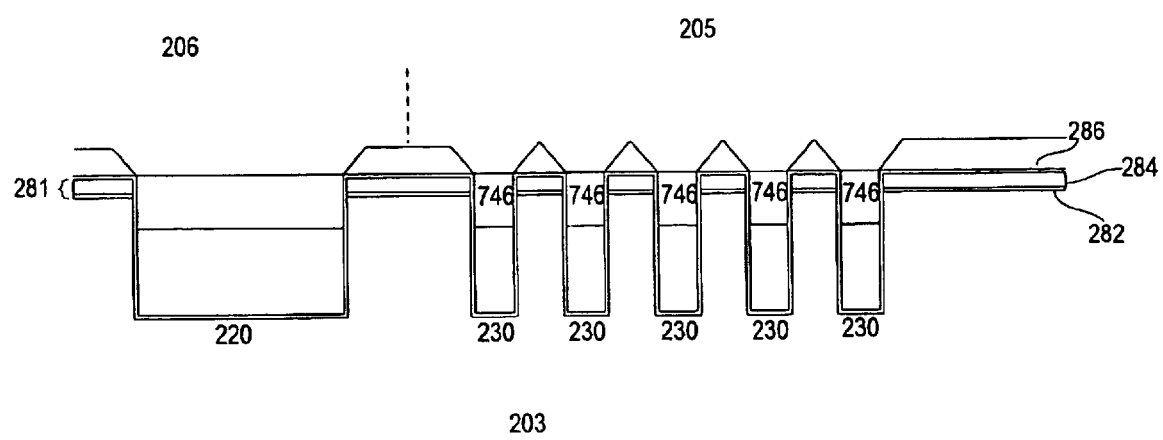

After the etch mask is removed, a dielectric material 746 is deposited to completely fill the deep isolation trenches in a second fill process, as shown in FIG. 7. The second fill process advantageously has an easier gap fill because of the lower aspect ratio trench provided by the first fill process. In one embodiment, the dielectric material comprises silicon oxide. Other types of dielectric materials are also useful. Preferably, the deep trenches are filled with silicon oxide using HDP techniques. Other techniques for depositing the dielectric material are also useful.

Figure 8:
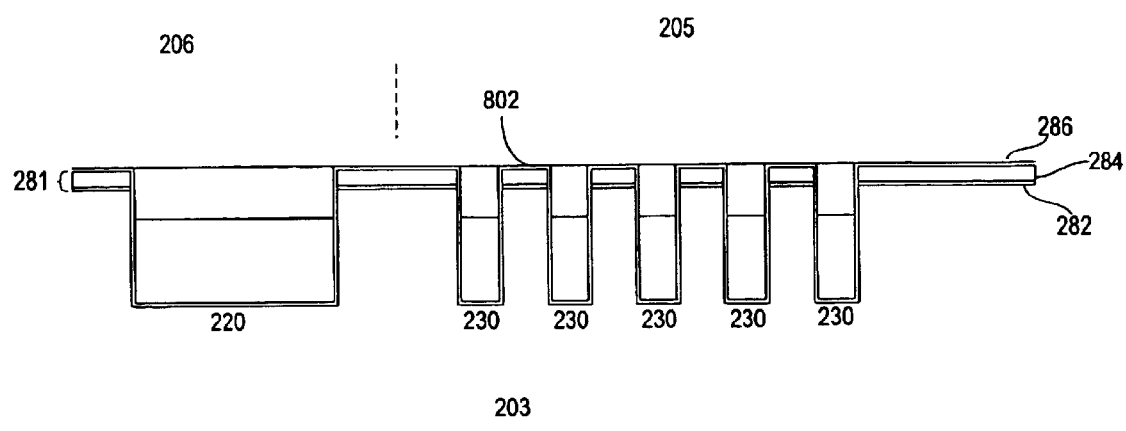

Referring to FIG. 8, the excess material on the surface of the substrate is removed by, for example, polishing techniques such as CMP. The CMP provides a planar surface 802 between the deep trenches and hard mask. The process continues to complete fabrication of the ICs. For example, the process continues to form necessary transistor gates and interconnections between the different devices of the IC.

By filling the deep isolation trenches in multiple fill-steps, various advantages are obtained. For example, the CMP step to remove the excess oxide is much shorter since only material from the final fill needs to be removed. Shorter CMP step reduces dishing and non-uniformity, thereby improving planarity of the resulting structure. Also, the final fill is improved because the aspect ratio of the trenches is reduced by the earlier fill. This improves the gap fill properties of the final fill.

While the invention has been particularly shown and described with reference to various embodiments, it will be recognized by those skilled in the art that modifications and changes may be made to the present invention without departing from the spirit and scope thereof. The scope of the invention should therefore be determined not with reference to the above description but with reference to the appended claims along with their full scope of equivalents.

What is claimed is:

1. A method of forming deep isolation trenches in IC fabrication comprising:

providing a substrate prepared with isolation trenches;

depositing a liner layer over the substrate;

after depositing a liner layer, at least partially filling the isolation trenches with a first dielectric material using an HDP-CVD technique, wherein the partial filling step deposits first dielectric material over a surface of the substrate;

depositing a mask layer on the substrate to cover the first dielectric material;

removing portions of the mask layer to expose the first dielectric material on the surface of the substrate while masking the first dielectric material within the trenches;

removing first dielectric material from over the surface of the substrate;

removing the mask layer;

filing the isolation trenches with a second dielectric material, wherein the filling step completely fills the trenches and deposits second dielectric material on the surface of the substrate; and removing excess second dielectric material from the surface of the substrate.

2. The method of claim 1 wherein the step of providing a substrate prepared with isolation trenches comprises:

providing a hard mask on the substrate;

patterning the hard mask to provide openings corresponding to locations where the isolation trenches are to be formed; and etching the substrate to the hard mask to form isolation trenches.

3. The method of claim 2 wherein the hard mask comprises silicon nitride and pad oxide.

4. The method of claim 3 wherein the hard mask further comprises silicon oxide.

5. The method of claim 2 wherein the isolation trenches comprise an aspect ratio of about 3:1 or higher.

6. The method of claim 1 wherein the isolation trenches comprise an aspect ratio of about 3:1 or higher.

7. The method of claim 6 wherein the first dielectric material comprises silicon oxide.

8. The method of claim 7 wherein the step of at least partially filling the isolation trenches comprises filling the isolation trenches to about 30–80%.

9. The method of claim 1 wherein the step of at least partially filling the isolation trenches comprises filling the isolation trenches to about 30–80%.

10. The method of claim 1 wherein the mask layer comprises a material which oxide can be removed selective thereto.

11. The method of claim 10 wherein the mask layer comprises polysilicon.

12. The method of claim 1 wherein the step of removing portions of the mask layer comprises a polishing process.

13. The method of claim 12 wherein the polishing process comprises chemical mechanical polishing.

14. The method of claim 12 wherein the step of removing the excess first dielectric material on the surface of the substrate comprises an etch.

15. The method of claim 14 wherein the etch comprises a wet etch selective to the mask layer.

16. The method of claim 1 wherein the step of removing the mask layer comprises a wet etch.

17. The method of claim 1 wherein the second dielectric material comprises silicon oxide.

18. The method of claim 17 wherein the step of filling the isolation trenches with the second dielectric layer comprises HDP techniques.

19. The method of claim 1 wherein the step of removing the excess second dielectric material from the surface of the substrate comprises polishing techniques.

20. The method of claim 19 wherein the polishing techniques comprise chemical mechanical polishing.

21. The method of claim 1 wherein the substrate is prepared with isolation trenches having a depth of about 300 to 700 nm below a top surface of the substrate.

22. The method of forming deep isolation trenches in IC fabrication comprising:

providing a substrate prepared with isolation trenches, wherein the isolation trenches have an aspect ratio of about 3:1 or higher, at least partially filling the isolation trenches with a first dielectric material using an HDP-CVD technique, wherein the partial filling step deposits excess first dielectric material on the surface of the substrate;

depositing a mask layer on the substrate to cover the first dielectric material;

removing portions of the mask layer to expose portions of the first dielectric material while masking the first dielectric material within the trenches;

removing first dielectric material from over the surface of the substrate;

removing the mask layer;

filling the isolation trenches with a second dielectric material, wherein the filling step completely fills the trenches and deposits second dielectric material over the surface of the substrate; and removing excess second dielectric material from over the surface of the substrate.

23. The method of claim 22 further comprising depositing a liner layer on the substrate before the step of at least partially filling the isolation trenches with the first dielectric material.

24. The method of claim 23 wherein the mask layer comprises a material which can be removed selective to the liner layer.

25. The method of claim 24 wherein the mask layer comprises polysilicon.

26. The method of claim 24 wherein the mask layer is about 50–300 Å thick.

27. The method of claim 22 wherein the first dielectric material comprises silicon oxide.

28. The method of claim 27 further comprising depositing a liner layer on the substrate before the step of at least partially filling the isolation trenches with the first dielectric material.

29. The method of claim 22 wherein the step of at least partially filling the isolation trenches comprises filling the isolation trenches to about 30–80%.

30. The method of claim 22 wherein the mask layer comprises polysilicon.

31. The method of forming deep isolation trenches in IC fabricating comprising:

providing a substrate prepared with isolation trenches;

at least partially filling the isolation trenches with a first dielectric material using an HDP-CVD technique, wherein the partial filling step deposits excess first dielectric material on the surface of the substrate;

depositing a mask layer on the substrate to cover the first dielectric material, wherein the mask layer is about 50–300 Å thick;

removing portions of the mask layer to expose portions of the first dielectric material while masking the first dielectric material within the trenches;

removing first dielectric material from over the surface of the substrate;

removing the mask layer, filling the isolation trenches with a second dielectric material, wherein the filling step completely fills the trenches and deposits second dielectric material on the surface of the substrate; and removing excess second dielectric material from the surface of the substrate.

32. A method of forming deep isolation trenches in IC fabrication comprising:

providing a substrate prepared with isolation trenches;

at least partially filling the isolation trenches with a first dielectric material using an HDP-CVD technique , wherein the partial filling step deposits excess first dielectric material on the surface of the substrate;

depositing a mask layer on the substrate to cover the first dielectric material, wherein the mask layer comprises polysilicon;

removing portions of the mask layer to expose portions of the first dielectric material while masking the first dielectric material within the trenches;

removing first dielectric material from over the surface of the substrate;

removing the mask layer;

filling the isolation trenches with a second dielectric material, wherein the filling step completely fills the trenches and deposits second dielectric material on the surface of the substrate; and removing excess second dielectric material from the surface of the substrate.

33. The method of claim 32 wherein removing portions of the mask layer comprises a polishing process.

34. The method of claim 32 wherein removing the mask layer comprises a wet etch.

35. The method of claim 32 wherein the first dielectric material comprises silicon oxide.

36. The method of claim 32 wherein at least partially filling the isolation trenches comprises filling the isolation trenches to about 30–80%.

* * * * *

UNITED STATES PATENT AND TRADEMARK OFFICE
CERTIFICATE OF CORRECTION

PATENT NO. : 6,821,865 B2
DATED : November 23, 2004
INVENTOR(S) : Wise et al.

It is certified that error appears in the above-identified patent and that said Letters Patent is hereby corrected as shown below:

Column 1,
Line 35, replace "trenches are" with -- trenches are filled with silicon oxide. --;
Line 40, replace "vigor" with -- vapor --;
Line 46, replace "(SA-CVD)," with -- (SA-CVD). --; and
Line 63, replace "wordlines to" with -- wordlines or --.

Column 2,
Line 56, replace "services" with -- devices --.

Column 6,
Lines 20 and 66, replace "The method" with -- A method --.

Column 7,
Line 27, replace "technique," with -- technique, --.

Signed and Sealed this

Twenty-second Day of February, 2005

JON W. DUDAS
*Director of the United States Patent and Trademark Office*